(12) United States Patent
Dufour et al.

(10) Patent No.: US 6,426,650 B1
(45) Date of Patent: Jul. 30, 2002

(54) INTEGRATED CIRCUIT WITH METAL PROGRAMMABLE LOGIC HAVING ENHANCED RELIABILITY

(75) Inventors: Yves Dufour; Rune Hartung Jensen, both of Sunnyvale, CA (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/473,538

(22) Filed: Dec. 28, 1999

(51) Int. Cl.[7] ............................................. H01L 25/00
(52) U.S. Cl. ............................ 326/47; 326/101; 326/9; 438/12; 438/14; 438/17; 365/200
(58) Field of Search ............................. 326/47, 9, 101, 326/102; 257/392; 438/12, 14, 17

(56) References Cited

U.S. PATENT DOCUMENTS

| | | | |
|---|---|---|---|
| 4,140,967 A | 2/1979 | Balasubramanian et al. | 324/73 |
| 5,083,083 A | 1/1992 | El-Ayat et al. | 324/158 R |
| 5,285,069 A | 2/1994 | Kaibara et al. | 257/392 |
| 5,315,177 A | 5/1994 | Zagar et al. | 307/465 |
| 5,528,600 A | 6/1996 | El Ayat et al. | 371/22.1 |
| 5,614,818 A | 3/1997 | El Ayat et al. | 324/158.1 |
| 5,804,960 A | 9/1998 | El Ayat et al. | 324/158.1 |
| 5,986,950 A | * 11/1999 | Joseph | 365/200 |
| 6,150,185 A | * 11/2000 | Lee et al. | 438/12 |
| 6,292,024 B1 | * 9/2001 | Jensen et al. | 326/47 |
| 6,323,048 B1 | * 11/2001 | Chevallier | 438/14 |

FOREIGN PATENT DOCUMENTS

JP 06112450 4/1994

OTHER PUBLICATIONS

Patent Abstracts of Japan, vol. 1998 No. 9, Jul. 31, 1998 of 10107235.
Patent Abstracts of Japan, vol. 1999 No. 14, Dec. 22, 1999 of 11261006.
"Gate Arrays" Peter Ammon, 1986 Dr. Alfred Huthig Verlag Heidelberg, pp. 94–95, 150–151.

* cited by examiner

Primary Examiner—Michael Tokar
Assistant Examiner—Vibol Tan
(74) Attorney, Agent, or Firm—John Vodopia (57) ABSTRACT

A method of manufacturing an integrated circuit having metal programmable logic cells. Metal programmable logic cells include transistors which, by varying routing of conductors in the metalization of the integrated circuit, may be connected in or disconnected from a logic path extending between the input and output of the cell. Transistors which are deselected by not being connected in the logic path are also decoupled from the supply rails. Generally speaking, deselected transistors can not be scan tested without substantial additional circuitry, as they do not form part of the logic path between the cell input and output to which the scan test circuitry is normally coupled. Decoupling transistors which are not in the logic path ensures that "stuck on" faults, in which transistors are stuck in a conductive state, do not allow current to flow between the supply rails through these faulty transistors, thus avoiding hot spots and reliability problems. By preventing damage even in the event of a "stuck on" fault, the need for extra test circuitry is avoided.

15 Claims, 8 Drawing Sheets

INTEGRATED CIRCUIT WITH METAL PROGRAMMABLE LOGIC HAVING ENHANCED RELIABILITY

BACKGROUND OF THE INVENTION

1. Field of the Invention

The invention is in the field of integrated circuits, and solves a problem related to reliability of integrated circuits having metal programmable logic.

2. Description of the Prior Art

Integrated circuits ("ICs") typically have a substrate, an active region on the substrate containing a large plurality of circuit elements such a transistors, resistors, capacitors etc., and a region adjacent the active region which has a plurality of conductor layers and insulating layers interspersed between the conductor layers. The conductor layers each include a large number of conductor tracks which are used to provide power to the circuit elements, as well as for signal routing between the elements.

During design and testing of an integrated circuit, or even after an IC has been in production, it is often necessary or desirable to revise the circuit operation to remove faults or to otherwise improve circuit operation. At the most severe end of the spectrum of revisions, the changes may require modifications to the masks which define the content and arrangement of circuit elements on the substrate. More frequently, however, the designer has anticipated potential problems and has included sufficient circuit elements on the integrated circuit to fix the problem. For example, the designers may include a selection of buffer circuit elements to remove timing problems in the signal routing. It is then a matter of modifying the conductor routing so as to decouple and/or couple certain of the circuit elements so as to implement the fix.

Additionally, many chip designs incorporate an identification ("ID") module which is readable by software. The purpose of the module ID is to allow software to identify the hardware and, based on the ID, configure the chip and the corresponding software. As the industry moves to systems on a chip design, where proven circuit modules are "plugged into" the IC, it will be desirable for each circuit module to have a corresponding module ID.

When making a circuit fix/enhancement to a particular module, it will typically be desirable to change the output of the module ID circuit, so that software will read a different ID code reflecting the change. One way to implement a module ID is with metal programmable logic. Metal programmable logic includes a region on an IC in which a plurality of logic gates are formed. The logic function implemented by these gates is selected by controlling how the gates are interconnected with conductors in the conductors layers. Changing the module ID is but one of many uses for metal programmable logic.

Integrated circuits typically contain built-in circuitry which allows the integrated circuit to be thoroughly tested. One well-known technique is boundary scan testing in which a chain of registers and flip-flops are included on the IC. Boundary scan circuits allow digital inputs to be applied to individual circuits while allowing monitoring of the output of a circuit in response to the known input. When the output is not as expected, the circuit then has a fault.

SUMMARY OF THE INVENTION

A problem with metal selectable logic that was recognized by the present inventors is that "deselected" transistors, i.e. transistors of a logic cell provided on the IC substrate but which are decoupled from the logic path of the cell by removing conductors which would otherwise couple these transistors to other transistors in the logic path, are not scan testable with typical scan test circuits. This is because scan test circuits are commonly coupled to the input and output of a cell. Thus, if the logic configuration is changed for example by coupling the output to a different node in the cell, thereby removing one or more transistors from the logic path between the cell input and the cell output, scan test data input to the cell input and read from the cell output will no longer be influenced by deselected transistors. If one of these deselected transistors has a fault, it will not be observed by the scan test. However, deselected transistors usually form a gate coupled between power supply rails of the logic cell. A failure mode is for deselected transistors to form an unwanted current path between the power supply rails which causes hot spots that can lead to premature failure of neighboring gates and malfunctioning of the integrated circuit. This normally occurs with "stuck on" faults in which a transistor is stuck in a conductive state.

Accordingly, it would be desirable to provide an IC with metal programmable logic in which the potential for damage to selected gates from non-selected gates is substantially reduced.

Generally, metal programmable logic cells are switchable between two or more logic configurations. Consequently, it would be possible to provide extra circuitry in the scan test circuit to test deselected gates. However, this is not desirable as it would add complexity, consume additional die area, and generally increase the cost of the integrated circuit.

Accordingly, it would be desirable to increase the confidence in the integrity of integrated circuits having metal programmable logic cells with deselected transistors without providing additional circuitry to actually scan test deselected gates.

Generally speaking, the invention is a method of improving the reliability of an integrated circuit having a metal-programmable logic cell in which the logic cell can be selected during manufacturing to have one of a first logic configuration and a second logic configuration by selection of conductor routing paths to select and deselect transistors for inclusion in a logic path of the cell. At least one transistor is deselected from the logic path of the cell by placing conductor routings so that the at least one transistor is functionally decoupled from the logic path of the cell. The deselected transistor is also decoupled from power supply rails of the cell so that no conductive path extends through the deselected transistor between the cell power supply rails.

When changing from one logic configuration to another, instead of merely changing conductor routing so as to deselect one or more transistors as in known methods, the present method goes further and makes additional conductor routing changes to provide an open circuit in the path of the main current channel of the deselected transistors. In this way, if a deselected transistor were to have a "stuck on" fault in which it remained conductive despite its control terminal being decoupled from other, selected transistors in the logic path, there will be no conductive path through the deselected transistor(s) between the cell power supply rails. In this way, hot spots and the reliability problems to the integrated circuit which this entails are avoided.

The method does not alter the fact that in the completed integrated circuit with a typical scan test circuit the deselected transistor(s) are not scan testable. Rather, the method removes a major source of reliability problems posed by "stuck on" fault conditions. Thus, the method provides an integrated circuit with deselected transistors with enhanced reliability. This alleviates the need to provide additional, area consuming elements in the scan test circuitry to test for "stuck on" faults, since even if a deselected transistor were to have such a fault, the reliability problem posed by this fault in prior art circuits has been removed by the method according to this invention.

The invention also relates to an integrated circuit manufactured according to the above method in which deselected transistors in a metal programmable logic cell have conductor routings with an open circuit so that no current path extends through the deselected transistors between the supply rails.

According to another aspect of the invention, an integrated circuit has an ID module comprising a metal programmable logic cell with deselected transistors electrically decoupled from the supply rails.

These and other objects, features and advantages of the invention will become apparent from the following detailed description and the drawings, both of which are illustrative and not limiting.

BRIEF DESCRIPTION OF THE DRAWINGS

FIGS. 3($a$), ($b$) are circuit diagrams of a register having two inverters in series;

FIGS. 4($a$), ($b$) illustrate cell layouts corresponding to the registers of FIGS. 3($a$), 3($b$);

FIG. 5($a$) is a circuit diagram of a register having a non-selected gate according to one aspect of the invention;

FIG. 5($b$) is a circuit diagram of a register having a non-selected gate according to another embodiment of the invention;

FIGS. 6(A)–6($b$) are exemplary cell layouts corresponding to FIGS. 5($a$), 5($b$);

FIGS. 7($a$); 7($b$) are circuit diagrams of an AND gate and a NAND gate according to the invention;

FIGS. 8($a$); 8($b$) are cell layouts corresponding to the circuits of FIGS. 7($a$); 7($b$)

DESCRIPTION OF THE PREFERRED EMBODIMENTS

Figure 1:
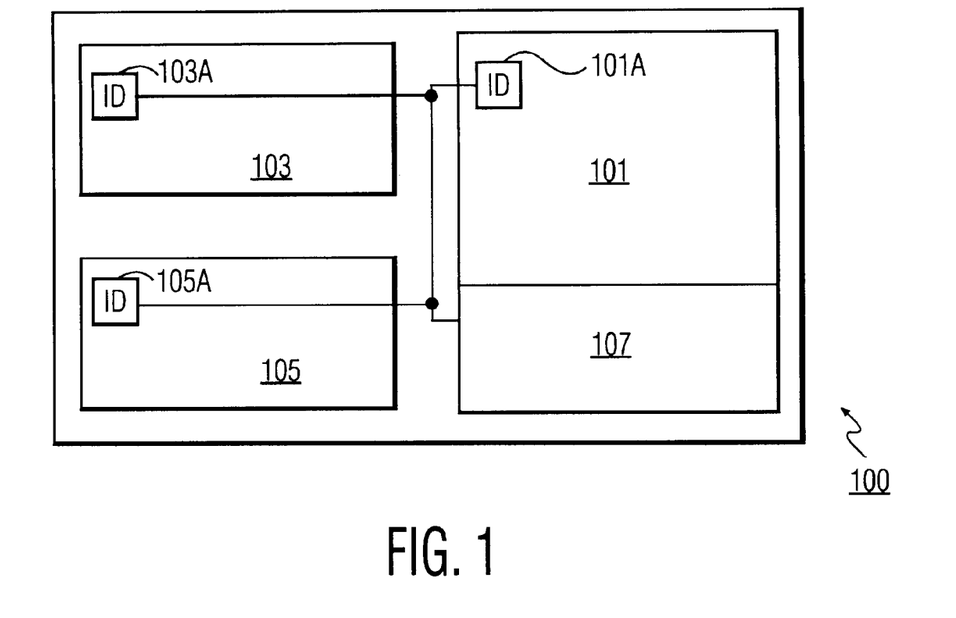
FIG. 1 diagrammatically illustrates an integrated circuit with a number of circuit modules and corresponding ID modules.

FIG. 1 illustrates an IC 100 having a plurality of circuit modules 101, 103, 105. Each of the circuit modules has a corresponding module ID circuit 101A, 103A, 105A. A circuit 107 provides a logic signal to each of the module ID circuits. The module ID circuits are coupled to an output pin of the IC so that the output of each module ID circuit can be read by an external device.

Figure 2:
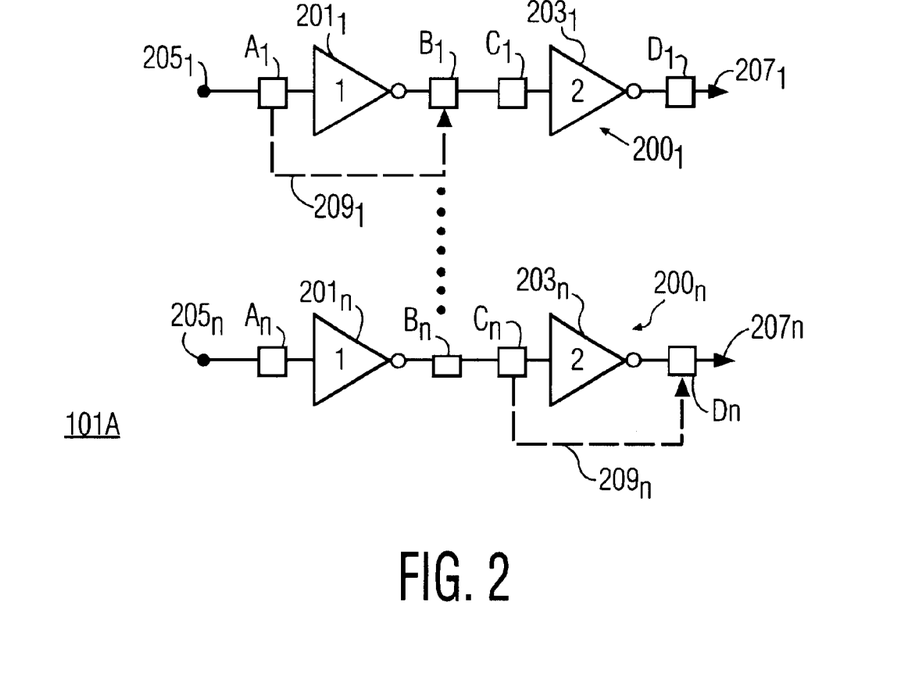
FIG. 2 illustrates cells of an exemplary identification module according to the invention.

FIG. 2 is a circuit diagram of an exemplary ID circuit 101A having a plurality of cells ($200_1$–$200_n$) Each cell includes an input ($205_1$–$205_n$), a first circuit element ($201_1$–$200_n$), a second circuit element ($203_1$–$203_n$) and an output ($207_1$–$207_n$) Each of the circuit elements is a logic gate in the form of an inverter. The cells are arranged in parallel to provide an identification code at the outputs 207 in response to a common logic signal applied to all of the cells at the inputs 205. For example, if n=5 and a logic "0" is applied to each of the inputs 205, the ID code output will be (0 0 0 0 0) since each cell is shown configured simply as a buffer. To change the code, one or more of the cells are configured to bypass one of the inverters. FIG. 2 shows the cell $200_1$ optionally being configured to bypass the first inverter $201_1$, as represented by the dashed bridging conductor $209_1$. Alternatively, a bridging conductor could bypass the second inverter, such as illustrated with dashed conductor $209_5$ for the cell $200_5$. If the first and fifth cells were so modified and the input kept the same, the output would then be (1 0 0 0 1). Generally, more cells would be included in each ID module, such as 32 to form a 32 bit ID.

While FIG. 1 shows each circuit module having a respective ID module for each circuit module, this is for a system on a chip implementation. ICs for other applications could have only some of the circuit modules with ID module's, or only one ID module for the IC.

As is well known in the art, generally, individual circuit elements are formed on top of a substrate of the integrated circuit. Connections to the individual transistors, resistors, capacitors to provide a source of potential as well as for signal routing are accomplished with conductor tracks arranged in a plurality of layers. The conductor tracks are typically of a metal, such as an alloy of aluminum or copper. The conductor layers are separated by an electrically insulating layer, such as silicon dioxide as one of many examples.

Figure 3A:
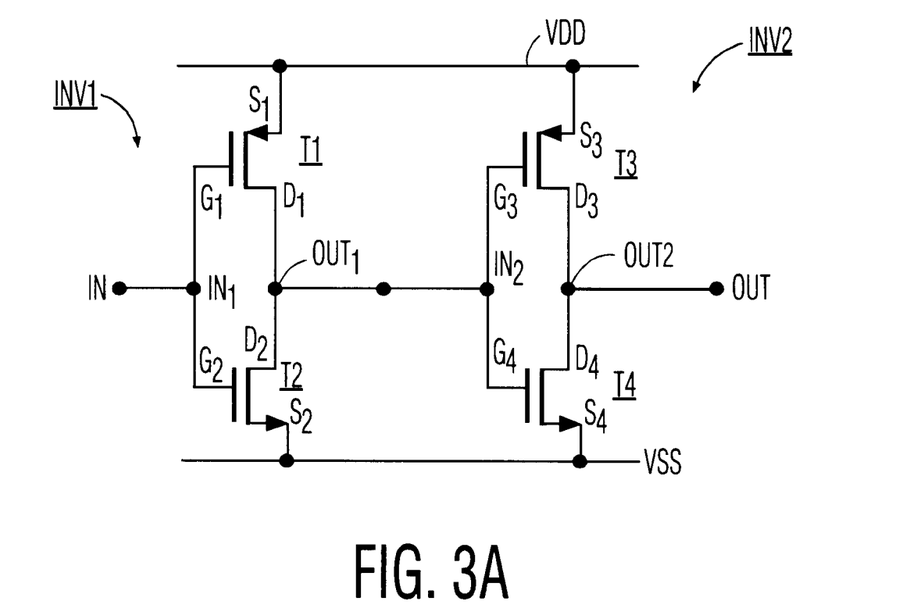
Figure 3B:
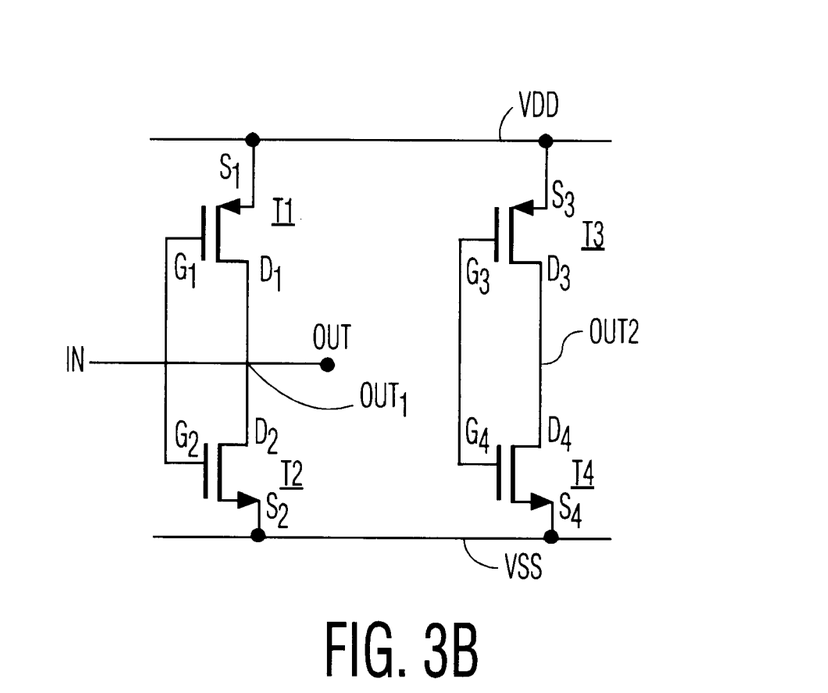

FIG. 3($a$) is a circuit diagram of an exemplary cell $200_1$ having a first inverter INV1 and a second inverter INV2. The inverters includes first and second CMOS transistors of opposite conductivity type having their main current channels coupled between first and second supply rails Vdd and Vss. The inverter INV1 has a PMOS transistor T1 with a source S1 coupled to the first rail Vss, a drain D1 coupled to the drain D2 of an NMOS transistor T2, which has its source S2 coupled to the second supply rail Vss. The input IN of the cell is coupled to the input IN1 of the first inverter and to the gates G1 and G2 of the first and second transistors T1, T2. The output of the first inverter OUT1 is coupled to the input IN2 of the second inverter. The second inverter includes third and fourth transistors coupled between the supply rails in an identical manner as the first inverter. When the cell input IN is logic high, the output OUT1 of the first inverter is logic low, with transistor T1 being off (non-conductive) and transistor T2 being on (conductive). The output OUT1 is thus coupled to Vss and is logic low. With input IN2 being logic low, the transistor T4 is off while the transistor T3 is conductive and couples the output OUT2 to the first rail Vdd. Thus, the output OUT2 of the second inverter and of the cell (OUT)is logic high. When used as a cell for a module ID circuit, the cell input will typically be the same for all sales, so the output of the cell is changed by rearranging how a respective conductor track is coupled to the cell. To change the cell output, an output conductor would be coupled to the output OUT1 of the first inverter, with the output OUT1 also being disconnected from the input IN2 of the second inverter. This configuration is illustrated in FIG. 3($b$). Thus, by selective conductor routing of an output conductor to either of the outputs OUT1 or OUT2, the logic function of the cell is effectively programmed during manufacture.

Figure 4A:
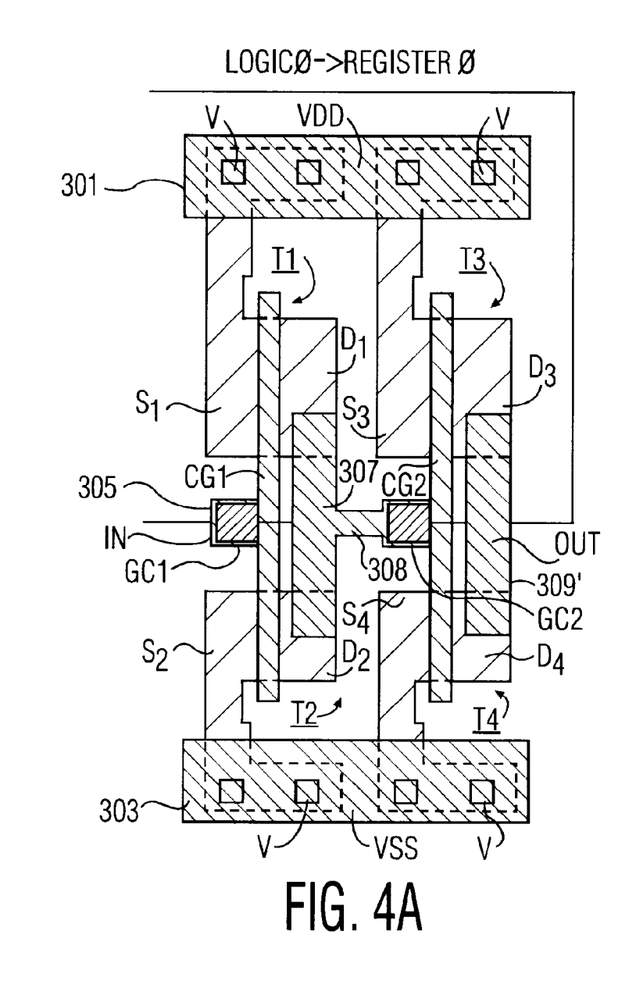
Figure 4B:
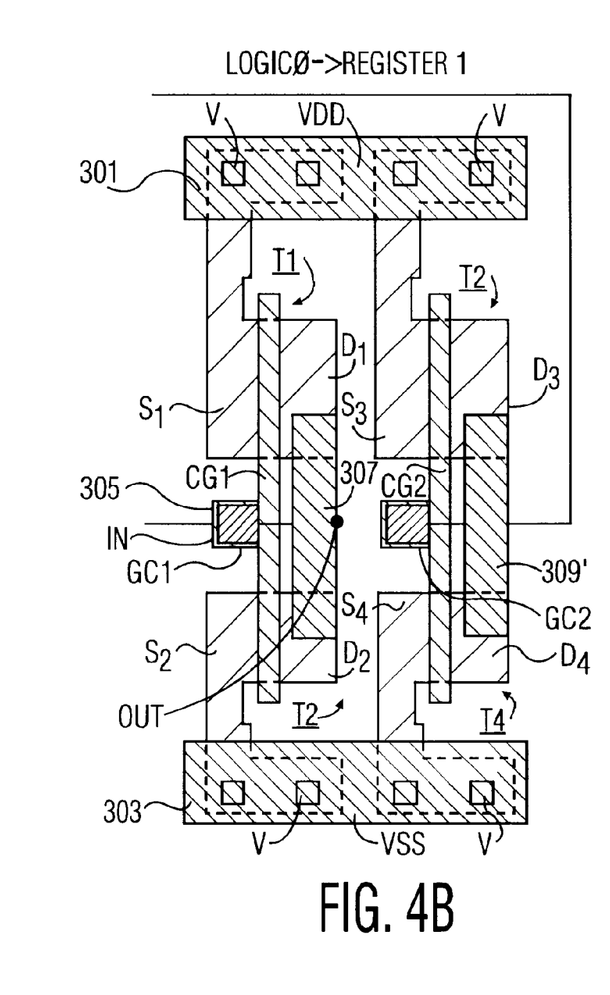

FIG. 4($a$) illustrates a CMOS layout for the cell of FIG. 3($a$). The respective drain and source regions are labeled for each transistor, with the labels corresponding to those of FIG. 3($a$). However, instead of each transistor having a separate gate, the first and second transistors have a common gate CG1 and the third and fourth transistors have a common gate CG2. The supply rails Vdd and Vss are formed by conductors 301, 303, in a first metal layer above the transistors, and are coupled to their respective sources by vias "V" which extend between the sources and rails in a conventional manner. The cell input IN is formed by a conductor 305 which is coupled to a gate contact GC1 connected to the common gate GC1. A conductor 307 connects the drains D1, D2 together and a conductor 308 connects the conductor 307 to the gate contact GC2, connected to the common gate CG2. A conductor 309 couples the drains of the third and fourth transistors to each other and forms the output OUT of the cell. FIG. 4(*b*) is identical to FIG. 4(*a*), with the exception that there is no conductor 309 connecting the output OUT1 of the first inverter to the input INV2 of the second inverter formed by gate contact GC2.

If the cell is to function as a buffer, the output OUT2 of the cell would be used by contacting an output conductor to conductor 309. Conversely, if the cell is to function as an inverter, an output conductor would be connected to the conductor 307 which forms the output OUT1 of the first inverter. The contact would be made for example from an output conductor in a higher metal layer connected with a via to the desired conductor 307, 308, 309.

A problem arises when the output OUT2 is not used, in that the functioning of the second set of transistors T3, T4 is not scan testable. The logic path extends from the input IN1 to the output OUT1. The transistors T3, T4 still have there drains D3, D4 coupled to each other so that a conductive path extends between the supply rails Vss, Vdd. If either of these devices has a fault, it cannot be detected because they are no longer part of the scan chain. A fault has consequences for the circuit, typically with respect to reliability. For example, if the transistor T3 leaks current, it can cause hot spots, which over time can cause surrounding transistors which are part of the logic circuit to fail.

Figure 5A:
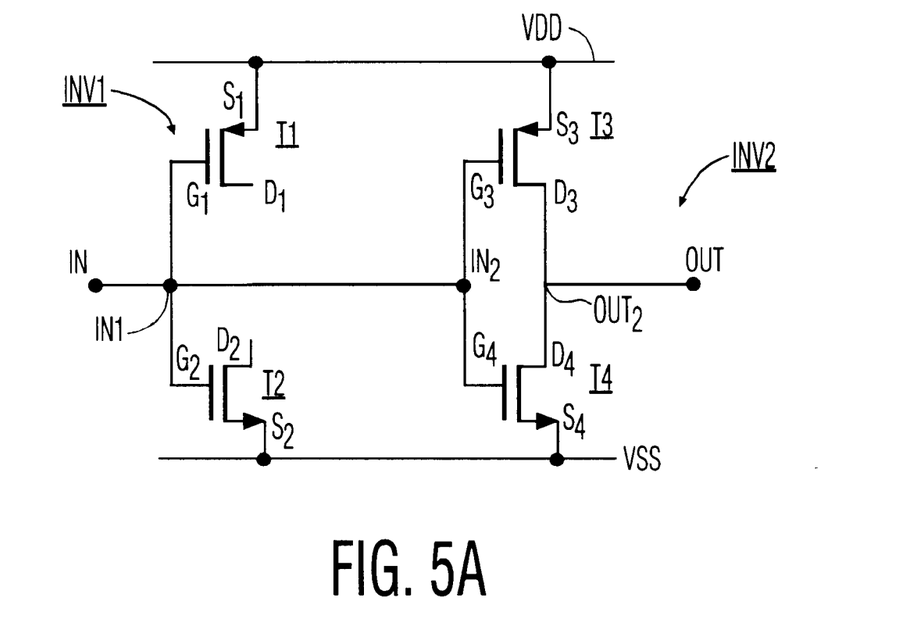
Figure 6A:
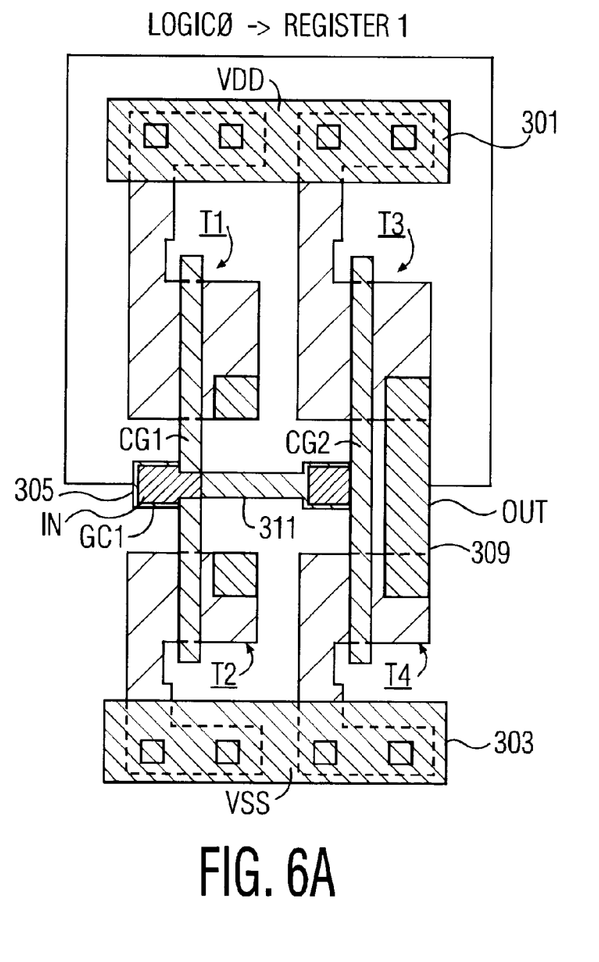

FIG. 5(*a*) shows a circuit diagram according to a first embodiment of the invention which avoids the above-mentioned failure scenario while still providing the same logic function. The change from the known configuration is that the cell input IN is connected to the input IN2, which couples the cell input directly to the input of the second inverter INV2. Additionally, the drains D1, D2 of the transistors T1, T2 are not connected and do not form a path between the two supply rails. Thus, a "stuck on" fault in either of the transistors T1, T2 would not allow a current to flow between the two supply rails. The reliability of these devices T1, T2 is thus not a significant issue, and the need for testing is alleviated. The corresponding layout is shown in FIG. 6(*a*) in which a conductor 311 connects the gate contact GC1 to the gate contact GC2, and no conductor connects the drains D1, D2 of the transistors T1, T2.

Figure 5B:
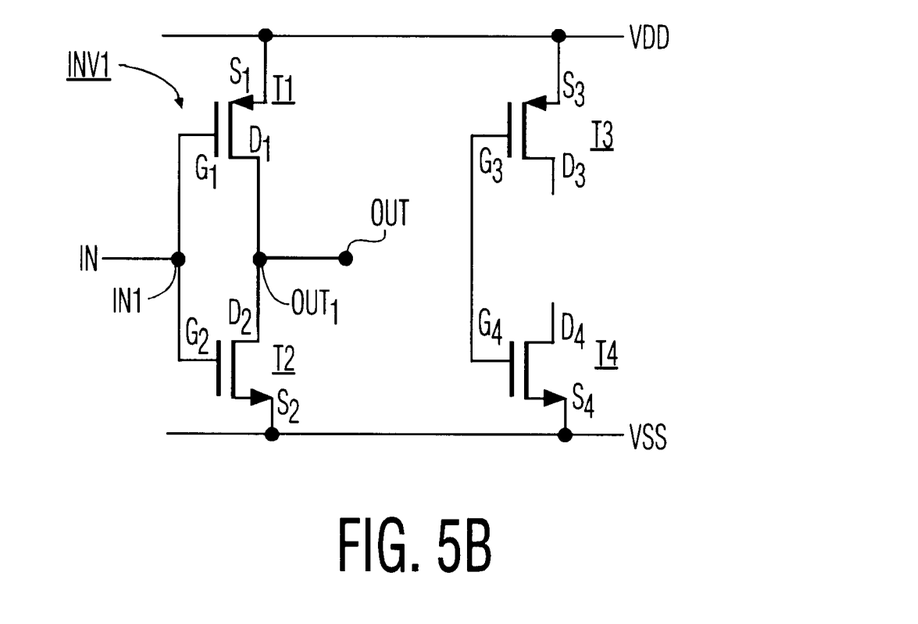
Figure 6B:
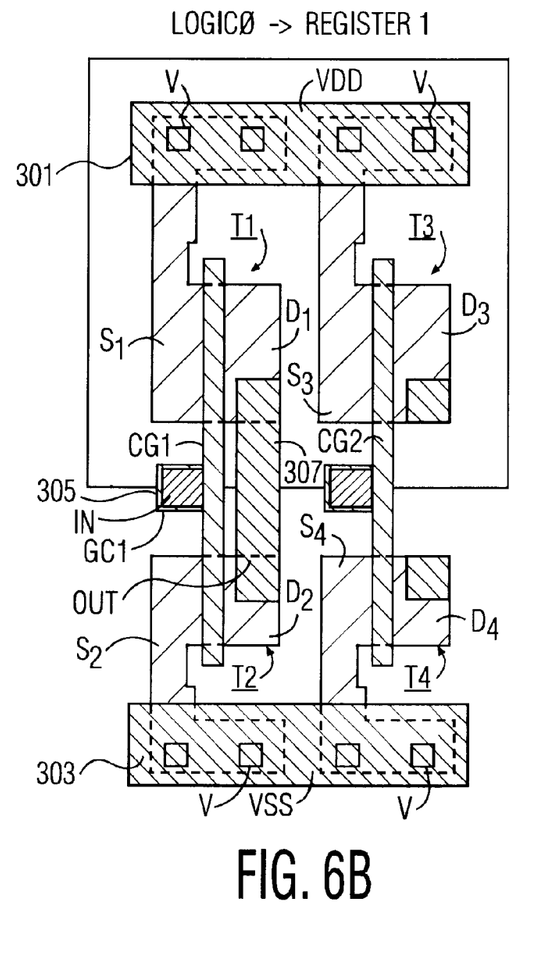

FIG. 5(*b*) shows another embodiment in which the inverting output is tapped at the output OUT1. However, drains D3, D4 of the third and fourth conductors are disconnected so that no conductive path is possible between the rails. As with FIG. 5(*a*), the cell functions as an inverter, but the risk of damage due to a "stuck on" fault is avoided. FIG. 6(*b*) shows the corresponding layout for FIG. 5(*b*).

Figure 7A:
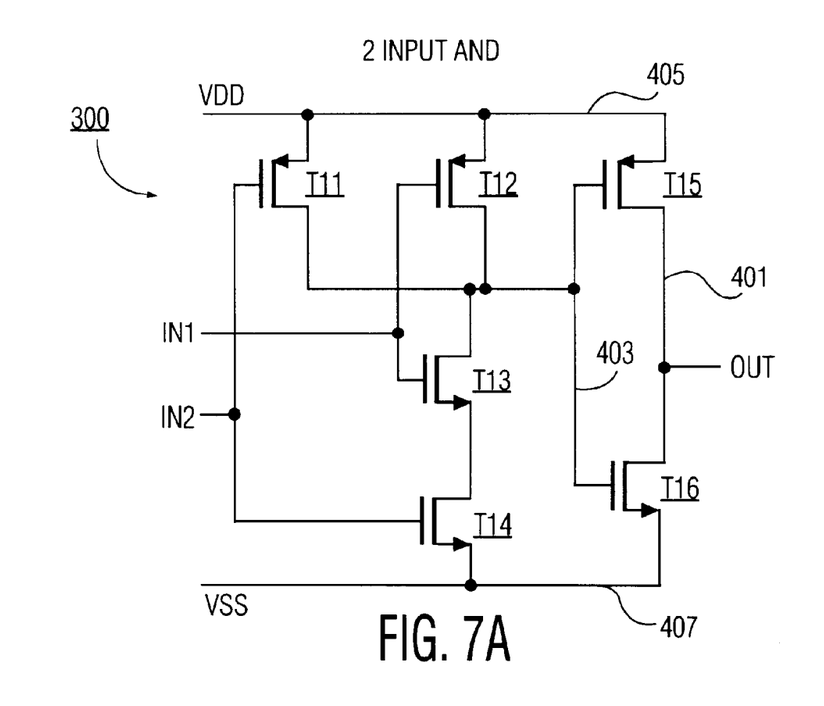
Figure 7B:
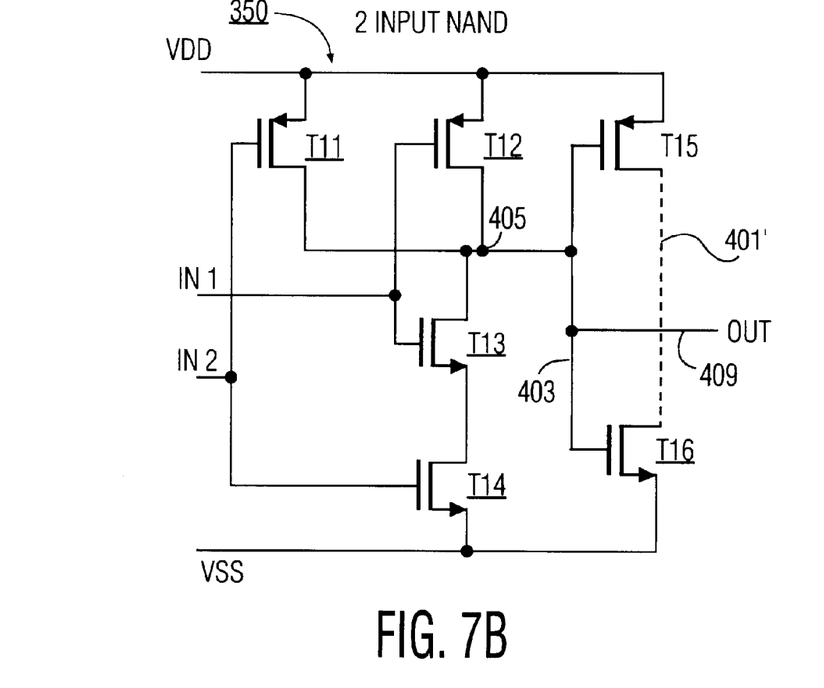

FIGS. 7(*a*); 7(*b*) illustrate another type of metal programmable logic cell according to the invention, in this case an AND gate 300 in FIG. 7(*a*) which can be converted to a NAND gate 350 by appropriate metal selection. AND gate 300 includes an inverter formed by the PMOS transistor T15 and NMOS transistor T16 whose drains are coupled together by a conductor 401 and whose gates are coupled together by a conductor 403. AND gate 300 further includes PMOS transistors T11, T12 having drains commonly connected to (i) the gates of transistors T15, T16 at conductor 403 and (ii) to the drain of a transistor T13 whose source is coupled to the drain of a transistor T14. A first input IN1 of the AND gate 300 is coupled to the gates of the transistors T12, T13 and a second input IN2 is coupled to the gates of the transistors T11 and T14.

The operation of AND gates and NAND gates are well known, and accordingly will not be discussed in detail. Essentially, the AND gate 300 is converted to a NAND gate 350 by coupling the output (out) of the cell so as to bypass the inverter formed by the transistors T15, T16. As shown in FIG. 7(*b*), the output of the cell is coupled at the input of the inverter at line 403, and effectively at node 405. In the prior art, the line 401 of the AND gate would not be removed as illustrated by dashed line 4011 in FIG. 7(*b*). However, with line 401' still connecting the drains of the non-selected inverter drain transistors T15, T16, there would still be a path between the supply rails Vdd and Vss. If a "stuck on" condition existed, this would pose the same reliability issues as discussed with respect to the inverter of cell 201 above. Thus, in the cell according to the invention, when making a metal change to connect the output at the line 403 instead of at the line 401, the line 401 is also removed. In this way, the potential problem from a "stuck on" condition is avoided.

Figure 8A:
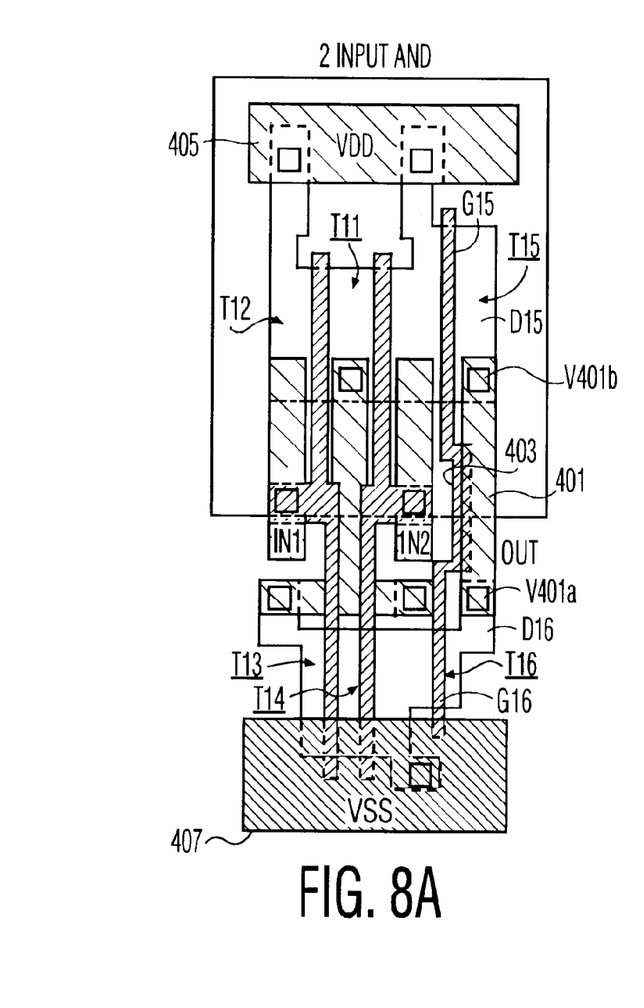
Figure 8B:
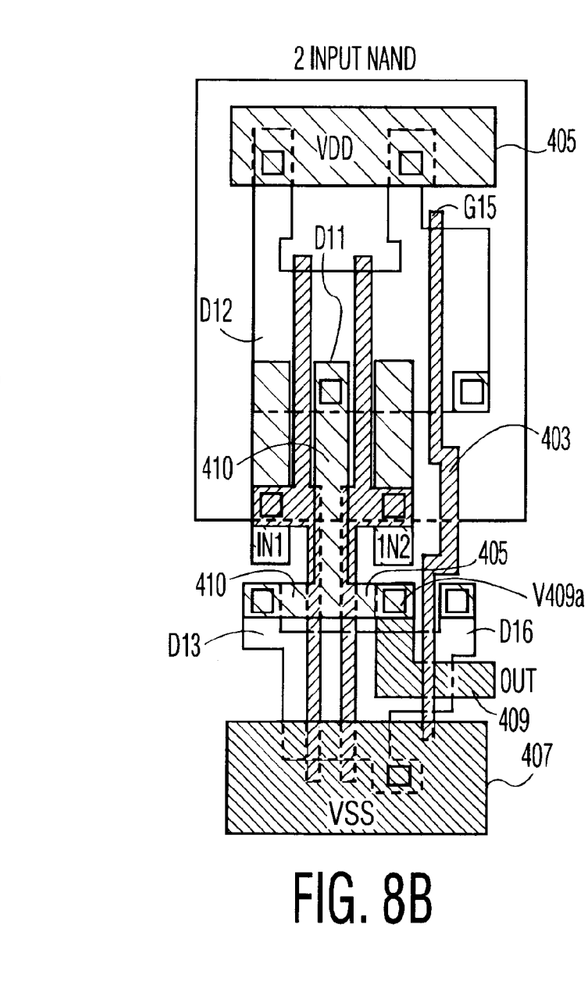

FIGS. 8(*a*) and 8(*b*) illustrate the cell layouts corresponding to the AND and NAND gates of FIGS. 7(*a*), (*b*). Portions of the layout corresponding to the conductors and transistors of FIGS. 7(*a*), 7(*b*), bear the same reference numerals. For brevity, only those portions of the layout relevant to the present invention will be discussed. In FIG. 8(*a*), a conductor 401 and vias 401*a*, 401*b* are shown which connect the drains D15, D16 of the inverter transistors T15, T16. The output of the AND gate 300 is formed by the conductor 401. To convert the AND gate to a NAND gate 350, a mask change is made in the metal layers of the IC in the portion defining the relevant cell, in this case AND gate 300. In this case, the relevant mask(s) defining the vias and metal layers are changed such that the conductor 401 is removed. It should be evident that the vias 401(*a*); 401(*b*) could also be removed as they are no longer used, but this would merely entail an unnecessary mask revision. In addition, the mask(s) are modified to add a conductor 409 and a via 409*a*, so that the output of the cell is now coupled to the commonly connected drains D11, D12, D13 corresponding to node 305 in FIG. 7(*b*).

Figure 9:
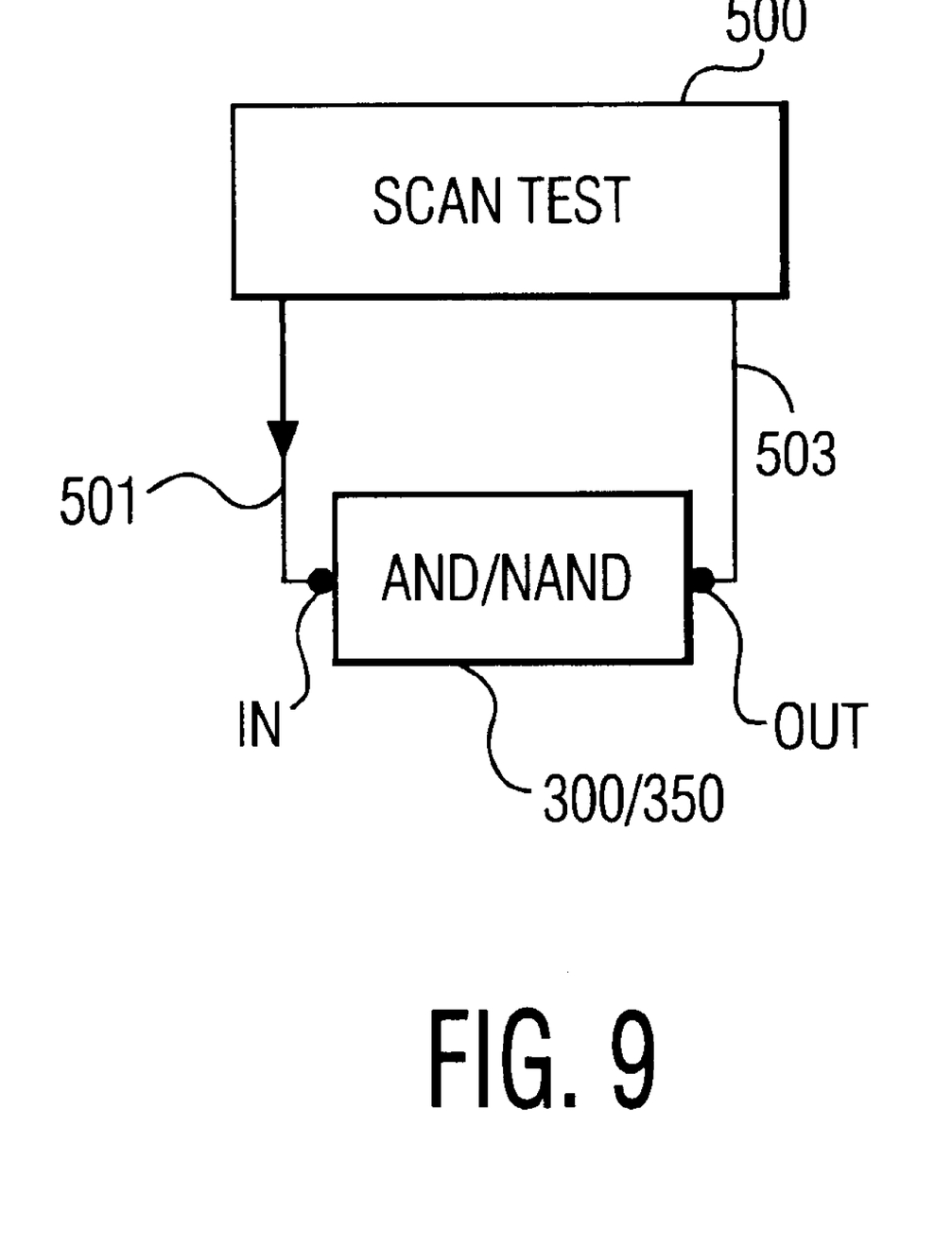
FIG. 9 diagrammatically illustrates an IC with a scan test circuit coupled to the cell input and cell output of a cell.

FIG. 9 illustrates a scan test circuit 500 coupled to the cell input and cell output of an exemplary cell 300/350. The scan test circuit feeds test data via line 501 to the cell input IN and reads output data of the cell from the cell output OUT via line 503. In the case of the cell being in the AND configuration, all transistors will be in the scan path. This is evident from FIG. 7(*a*) in which the cell output OUT is connected to line 401. When configured as a NAND gate 350, however, the transistors T15/T16 will not be in the scan path and "stuck on" faults in these two transistors will not be detected. This is evident from FIG. 7(*b*) since the cell output OUT is connected to line 403. However, by reason of the drains of T15/T16, even if a stuck on condition exists, there is no current path between the supply rails, so hot spots and the ensuing failures caused thereby will not occur.

The structure and method described above are not limited to the use of module ID circuits, but in any metal programmable logic circuit.

It is understood in the art that routing software is used to layout the conductor tracks in the various conductor layers.

Furthermore, software is used to generate masks for the mask sets which are used in manufacturing an IC. Changes in conductor routing for a logic cell will therefore be initially selected with software tools, which will then be reflected in a modified mask or masks which controls the formation/ location of conductor paths.

The technology by which the invention is made is not important and any of the standard bipolar, CMOS or BiCMOS processes can be used.

Although preferred embodiments of the present invention have been shown and described, it will be appreciated by those skilled in the art that changes may be made in these embodiments without departing from the principles and spirit of the invention, the scope of which is defined in the claims. For example, it will be clear from the foregoing that the open circuit placed in the path between the supply rails for deselected transistors may be placed in any convenient location.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of improving the reliability of an integrated circuit having a metal-programmable logic cell in which the logic cell can be selected during manufacturing to have one of a first logic configuration and a second logic configuration by selection of conductor routing paths to select and deselect transistors for inclusion in a logic path of the cell, the method comprising:

deselecting at least one transistor from the logic path of the cell by placing conductor routings so that the at least one transistor is functionally decoupled from the logic path of the cell; and decoupling a main current path of the at least one deselected transistor from power supply rails of the cell so that no conductive path extends through the deselected transistor between the cell power supply rails.

2. A method according to claim 1, wherein in said first configuration said logic cell is a buffer and the logic path includes a cell input coupled to a first inverter, a second inverter having an input coupled to an output of the first inverter, and a cell output at an output of the second inverter, and in said second configuration one of the inverters is decoupled from the logic path with one of (i) the cell input being coupled to the input of the second inverter and not the first inverter and (ii) the cell output being connected to the output of the first inverter and not the output of the second inverter.

3. A method according to claim 2, wherein in the first configuration each inverter includes a PMOS transistor and an NMOS transistor having drains coupled by at least one conductor and in the second configuration the drains of said one decoupled inverter are decoupled from each other.

4. A method according to claim 1, wherein in the first configuration said logic cell defines an AND gate and in the second configuration said logic cell defines a NAND gate.

5. A method according to claim 4, wherein the logic path includes an inverter having an inverter input and an inverter output, in the first configuration the cell output being coupled to the inverter output and in the second configuration the cell output being coupled to the inverter input.

6. A method according to claim 5, wherein in the first configuration the inverter includes a PMOS transistor and an NMOS transistor having drains coupled by at least one conductor and in the second configuration the drains of the inverter are decoupled from each other.

7. An integrated circuit, comprising:

first and second cell supply rails;

a metal programmable logic cell including a cell input and a cell output, at least one selected transistor included in a logic path between the cell input and the cell output, and at least one deselected transistor electrically decoupled from the logic path, the at least one deselected transistor having a main current path electrically decoupled from one of the supply rails, whereby the deselected transistor if stuck in a conductive state during circuit operation does not provide a current path between the first and second supply rails.

8. An integrated circuit according to claim 7, further comprising a scan test circuit coupled to the cell input and the cell output.

9. An integrated circuit according to claim 7, wherein said logic cell includes a deselected inverter decoupled from the logic path, the inverter comprising a PMOS transistor and an NMOS transistor each having a source coupled to a respective supply rail and each having a drain, the drains being decoupled from each other defining an open circuit between the PMOS and NMOS transistor.

10. An integrated circuit according to claim 7, wherein said cell includes a plurality of transistors having main current paths arranged between the first and second supply rails, the plurality of transistors being deselected transistors not coupled in the logic path, the cell being arranged with conductor routing such that no current path exists through any of the deselected transistors between the first and second supply rails.

11. An integrated circuit, comprising:

first and second cell supply rails;

a plurality of logic cells each including the same spatial array of a plural number of transistors, each transistor of a logic cell having a correspondingly arranged transistor in each of the other of the plurality of logic cells, each logic cell including a cell input and a cell output, the plurality of logic cells having cells defining a first logic configuration and other cells defining a second logic configuration, the first and second logic configuration differing by (i) at least one corresponding transistor in cells of the first configuration being electrically coupled in a logic path between the cell input and the cell output and by the at least one corresponding transistor in cells of the second configuration being electrically decoupled from the logic path between the cell input and cell output, and (ii) in cells of the first configuration, said at least one corresponding transistor includes a main current path coupled between the supply rails of the integrated circuit and in cells of the second configuration, said at least one corresponding transistor having a main current path decoupled from at least one of the first and second supply rails.

12. An integrated circuit according to claim 11, wherein cells of the first configuration include a PMOS and an NMOS transistor defining an inverter in the logic path between the cell input and the cell output, the PMOS and NMOS transistors having main current paths electrically coupled to each other and the first and second supply rails, and     in the cells of the second configuration the corresponding PMOS and NMOS transistors not being electrically coupled in the logic path between the cell input and the cell output and the main current paths of the NMOS and PMOS transistors being electrically decoupled from each other.

13. An integrated circuit according to claim 11, wherein cells of the first configuration define a buffer and cells of the second configuration define an inverter.

14. An integrated circuit according to claim 13, wherein said integrated circuit includes an ID module comprising logic cells of said first and second configurations.

15. An integrated circuit according to claim 11, wherein cells of the first configuration define an AND gate and cells of the second configuration define a NAND gate.

\* \* \* \* \*